United States Patent
Seddon et al.

(10) Patent No.: US 12,020,972 B2
(45) Date of Patent: Jun. 25, 2024

(54) CURVED SEMICONDUCTOR DIE SYSTEMS AND RELATED METHODS

(71) Applicant: SEMICONDUCTOR COMPONENTS INDUSTRIES, LLC, Phoenix, AZ (US)

(72) Inventors: Michael J. Seddon, Gilbert, AZ (US); Francis J. Carney, Mesa, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 557 days.

(21) Appl. No.: 16/862,184

(22) Filed: Apr. 29, 2020

(65) Prior Publication Data
US 2021/0343574 A1   Nov. 4, 2021

(51) Int. Cl.
| | | |
|---|---|---|
| *H01L 21/683* | (2006.01) | |
| *H01L 23/00* | (2006.01) | |
| *H01L 23/32* | (2006.01) | |
| *H01L 23/538* | (2006.01) | |
| *H01L 27/146* | (2006.01) | |

(52) U.S. Cl.
CPC .......... *H01L 21/6838* (2013.01); *H01L 23/32* (2013.01); *H01L 23/5387* (2013.01); *H01L 23/562* (2013.01)

(58) Field of Classification Search
CPC ............. H01L 2924/3511; H01L 23/00; H01L 23/538; H01L 21/683; H01L 27/14618; H01L 21/6838; H01L 23/562; H01L 23/32; H01L 23/5387; H01L 24/00; H01L 27/14601; H01L 23/3107; H01L 21/6835; H01L 2221/68327; H01L 2224/05018; H01L 2224/05558

USPC .......................................................... 29/281
See application file for complete search history.

(56) References Cited

U.S. PATENT DOCUMENTS

| | | | | |
|---|---|---|---|---|
| 9,570,421 | B2 * | 2/2017 | Wu .................. | H01L 23/49827 |
| 10,418,408 | B1 * | 9/2019 | Zheng ................. | H04N 5/3696 |
| 2005/0082684 | A1 * | 4/2005 | Aiba ...................... | H01L 25/50 |
| | | | | 257/E29.022 |
| 2008/0157345 | A1 * | 7/2008 | Lu ......................... | H01L 23/42 |
| | | | | 438/122 |
| 2009/0059563 | A1 * | 3/2009 | Takata ............. | G02F 1/133606 |
| | | | | 362/97.1 |
| 2010/0195040 | A1 * | 8/2010 | Koganezawa ....... | G02F 1/1339 |
| | | | | 349/153 |
| 2012/0044618 | A1 * | 2/2012 | Lee ....................... | G02F 1/1303 |
| | | | | 361/679.01 |

(Continued)

FOREIGN PATENT DOCUMENTS

| | | | | |
|---|---|---|---|---|
| CN | 101777549 A | * | 7/2010 | ... H01L 2224/48091 |
| CN | 105957932 A | * | 9/2016 | ......... H01L 33/0093 |

(Continued)

*Primary Examiner* — Herve-Louis Y Assouman
(74) *Attorney, Agent, or Firm* — Adam R. Stephenson, LTD.

(57) ABSTRACT

Implementations of a curved die system may include a semiconductor die; and a die curvature support structure including an organic material coupled to a surface of the semiconductor die. The die curvature support structure may induce warpage greater than 200 microns in the surface of the semiconductor die. The die curvature support structure may be configured to induce warpage prior to coupling the semiconductor die to a correspondingly curved substrate.

19 Claims, 5 Drawing Sheets

(56) References Cited

U.S. PATENT DOCUMENTS

| | | | |
|---|---|---|---|
| 2012/0104580 A1 | 5/2012 | Feng et al. | |
| 2016/0056091 A1* | 2/2016 | Kim | H01L 23/49844 |
| | | | 257/773 |
| 2017/0194228 A1* | 7/2017 | Heng | H01L 21/568 |
| 2018/0114705 A1* | 4/2018 | Lin | H01L 21/565 |
| 2019/0103345 A1* | 4/2019 | Yazzie | H01L 23/49816 |
| 2019/0252236 A1* | 8/2019 | Igarashi | H01L 21/68742 |
| 2020/0105553 A1* | 4/2020 | Kim | H01L 21/67138 |
| 2020/0105640 A1* | 4/2020 | Chiu | H01L 23/40 |
| 2020/0365408 A1* | 11/2020 | Seddon | H01L 21/568 |
| 2021/0249333 A1* | 8/2021 | Lewison | H01L 23/427 |
| 2021/0343612 A1* | 11/2021 | Carney | H01L 21/6835 |

FOREIGN PATENT DOCUMENTS

| | | | | | |
|---|---|---|---|---|---|
| CN | 106783751 | A | * | 5/2017 | H01L 24/01 |
| CN | 105074512 | B | * | 7/2017 | B29C 59/021 |
| CN | 206863791 | U | * | 1/2018 | G06K 19/077 |
| CN | 107845620 | A | * | 3/2018 | H01L 21/4846 |
| CN | 108237155 | A | * | 7/2018 | B21D 35/002 |
| CN | 209418492 | U | * | 9/2019 | H01L 2224/49171 |
| CN | 110631715 | A | * | 12/2019 | H01L 27/1446 |
| CN | 110695180 | A | * | 1/2020 | B21D 25/02 |
| JP | 2004115583 | A | * | 4/2004 | H01L 2924/3511 |
| JP | 2012178422 | A | * | 9/2012 | H01L 23/12 |
| JP | 2016213321 | A | * | 12/2016 | H01L 2224/12105 |
| JP | 2018049868 | A | * | 3/2018 | H01L 21/02 |
| KR | 20160085367 | A | * | 7/2016 | H01L 2924/3511 |
| WO | 2017/138492 | A1 | * | 8/2017 | H01L 25/115 |
| WO | 2004015758 | A1 | * | 2/2019 | H01L 29/0657 |
| WO | 2019215805 | A1 | * | 11/2019 | H01L 23/293 |
| WO | 2020/075265 | A1 | * | 4/2020 | G02B 27/10 |

\* cited by examiner

CURVED SEMICONDUCTOR DIE SYSTEMS AND RELATED METHODS

BACKGROUND

1. Technical Field

Aspects of this document relate generally to semiconductor device packages, such as systems for supporting semiconductor die. More specific implementations involve curved semiconductor die.

2. Background

Semiconductor packages include one or more semiconductor die. Semiconductor packages act to protect the one or more semiconductor die from various environmental contaminants or influences like moisture, electrostatic discharge, or light.

SUMMARY

Implementations of a curved die system may include a semiconductor die; and a die curvature support structure including an organic material coupled to a surface of the semiconductor die. The die curvature support structure may induce warpage greater than 200 microns in the surface of the semiconductor die. The die curvature support structure may be configured to induce warpage prior to coupling the semiconductor die to a correspondingly curved substrate.

Implementations of curve die systems may include one, all, or any of the following:

The semiconductor die may be one of an image sensor or a sensor die.

The die curvature support structure may be coupled to a largest planar surface of the semiconductor die.

The die curvature support surface induces warpage through rotating against the surface of the semiconductor die.

The die curvature support surface induces warpage through pressing against the surface of the semiconductor die.

The semiconductor die may be between 0.1 microns to 125 microns thick.

Implementations of a method of forming a curved semiconductor die system may include warping a surface of a semiconductor die against a first surface to greater than 200 microns; applying an organic material to at least a portion of the surface of the semiconductor die; and releasing the semiconductor die from the first surface; wherein after covering the surface with the organic material, the semiconductor die may be warped to permit bonding with a second surface.

Implementations of a method of forming curved semiconductor die systems may include one, all, or any of the following:

Warping the semiconductor die against the surface further may include using vacuum force.

The method may include singulating the organic material on the surface of the semiconductor die.

Singulating further may include singulating using one of sawing, lasering, water jet ablating, scribing, cutting, and any combination thereof.

The organic material may be a mold compound.

The semiconductor die may be between 0.1 microns and 125 microns thick.

Releasing the semiconductor die from the surface further may include releasing vacuum force against the surface.

Implementations of a method of forming a curved semiconductor die system may include coupling a die curvature support structure including an organic compound to a surface of a semiconductor die; and inducing warpage greater than 200 microns in the surface of the semiconductor die using the die curvature support structure prior to bonding the semiconductor die to a curved surface.

Implementations of a method of forming a curved semiconductor die system may include one, all, or any of the following:

Inducing warpage further may include rotating the die curvature support structure against the surface.

Inducing warpage further may include pressing the die curvature support structure against the surface.

Coupling the die curvature support structure may include molding the die curvature support structure to the surface.

Coupling the die curvature support structure further may include bonding to a bonding structure on the surface.

The semiconductor die may be between 0.1 microns and 125 microns in thickness.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended curved die systems will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such curved die systems, and implementing components and methods, consistent with the intended operation and methods.

Figure 1:
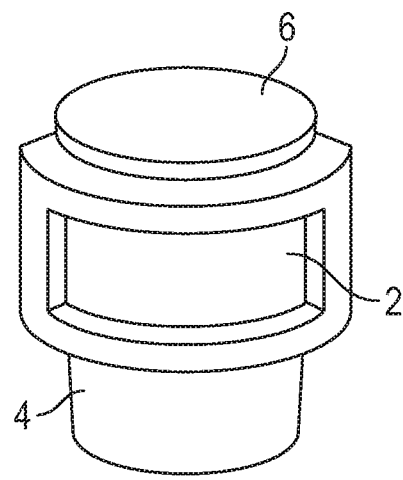
FIG. 1 is a perspective view of an implementation of a curved image sensor die coupled with a curved surface.

In various operating situations, the use of sensors with a curved sensing devices can be helpful/essential to properly gather data for the operation of a machine, robot, or other system. For example, as illustrated in FIG. 1, an implementation of a curved image sensor 2 designed to receive electromagnetic radiation (light, ultraviolet, x-ray, infrared, laser, etc.) is illustrated. The advantage of the curved image sensor 2 in the implementation of FIG. 1 is that the sensor can be more easily bonded/attached to the curved surface 4 of the component 6 to which the sensor 2 is attached. Furthermore, the field of view of the curved image sensor is greater than the 180 degree maximum possible field of view a flat image sensor could theoretically have.

Figure 2:
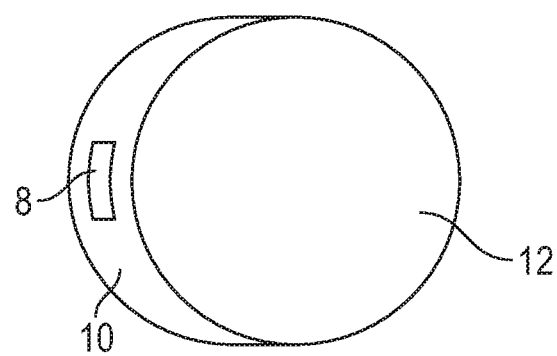
FIG. 2 is a perspective view of a curved image sensor die coupled with a curved surface.

In other applications, the ability to attach a sensor to a curved surface to enable data collection/monitoring at or of that surface may be useful in various systems (wheels, balls, pistons, etc.). Referring to FIG. 2, an implementation of such a sensor 8 bonded to curved surface 10 of cylinder 12 is illustrated. In various implementations, this sensor 8 could be any of a wide variety of sensor types, including, by non-limiting example, inertial sensors, thermocouples, light sensors, pressure sensors, or any other sensor type. In various implementations, the sensor 8 may be incorporated into a semiconductor package and include, by non-limiting example, corresponding curved encapsulation, one or more curved semiconductor die, one or more curved substrates, one or more curved leadframes, electrical connectors, and any other semiconductor package component.

Figure 3:
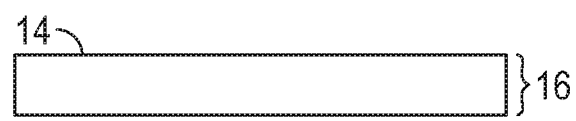
FIG. 3 is a side view of an implementation of a thinned die.

Referring to FIG. 3, a side view of an implementation of a thinned semiconductor die 14 is illustrated. In various implementations disclosed herein, the thickness 16 of the thinned semiconductor die 14 may be between about 0.1 microns and about 125 microns. In other implementations, the thickness may be between about 0.1 microns and about 100 microns. In other implementations, the thickness may be between about 0.1 microns and about 75 microns. In other implementations, the thickness may be between about 0.1 microns and about 50 microns. In other implementations, the thickness may be between about 0.1 microns and about 25 microns. In other implementations, the thickness may be between about 0.1 microns and about 10 microns. In other implementations, thickness may be between 0.1 microns and about 5 microns. In other implementations, the thickness may be less than 5 microns.

The thinned semiconductor die disclosed herein may be of various die sizes. Die size generally refers to measured principal dimensions of the perimeter of the die. For example, for a rectangular die that is a square, the die size can be represented by referring to a height and width (length and width) of the perimeter. In various implementations, the die size of the semiconductor die may be at least about 4 mm by about 4 mm where the perimeter of the die is rectangular. In other implementations, the die size may be smaller. In other implementations, the die size of the semiconductor die may be about 211 mm by about 211 mm or smaller. For die with a perimeter that is not rectangular, the surface area of the largest planar surface of die may be used as a representation of the die size. The various thinned die disclosed herein may have a perimeter that includes any closed shape in various implementations.

Where the semiconductor die is thinned, the ability for the material of the semiconductor die to bend/warp increases. This ability to bend/warp depends also on the material(s) used to form the semiconductor die. In various implementations of semiconductor die disclosed herein, the material/substrate of the die may be any of a wide variety of materials including, by non-limiting example, silicon, silicon carbide, silicon-on-insulator, gallium arsenide, ruby, sapphire, silicon dioxide, glass, or any other semiconductor material type. In various implementations, the thinned die may need to adjustably warp to accommodate surfaces with different radii of curvature. Accordingly, the thickness of the semiconductor die may be determined/prepared according to calculations indicating that the semiconductor die can successfully be warped/bent into a shape with a sufficient radius of curvature to accommodate one or more curves of the surface to which the semiconductor die will be bonded/attached. Also, various material types of the semiconductor devices included on the semiconductor die may be selected to accommodate the needed radius of curvature.

Figure 4:
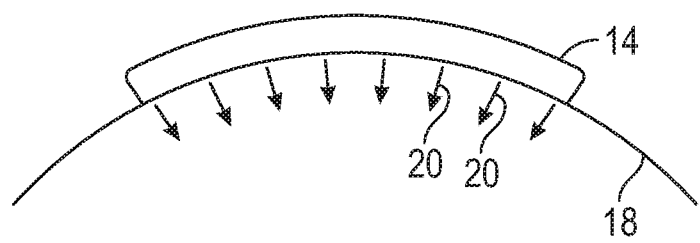
FIG. 4 is a side view of the thinned die of FIG. 3 warped against a surface using vacuum force.

Referring to FIG. 4, the thinned semiconductor die 14 is illustrated coupled against a forming surface 18 that has a predetermined radius of curvature/curved shape. As illustrated, vacuum force 20 is applied through various openings in the forming surface 18 that act to warp the largest planar surface (or other surface) of the semiconductor die 14 against the forming surface 18. While the use of vacuum force 20 is illustrated in FIG. 4, in other implementations the die 14 may be held against the forming surface 18 using, by non-limiting example, magnetic force, molding force, adhesive force, electrostatic force, or any other force or system capable of warping a surface of the die against/to the forming surface 18.

Figure 5:
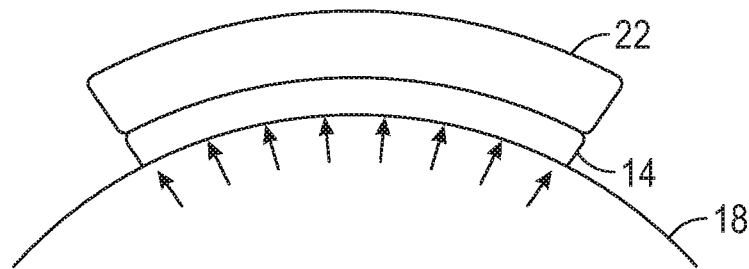
FIG. 5 is a side view of the thinned die of FIG. 5 being released against a surface after application of organic material to the largest planar surface of the thinned die.

Following warping the semiconductor die 14 against the forming surface 18, an organic material 22 is applied over the semiconductor die 14 on a surface of the die opposite the forming surface 18, as illustrated in FIG. 5. This organic material may, in some implementations, be a permanent supporting material that remains with the die and becomes part of the final semiconductor package that is eventually coupled with to the surface where the sensing will take place. In other implementations, the organic material may be a temporary supporting material that acts to hold the die at the desired radius of curvature/shape until the die is bonded with the surface or with other components of the semiconductor package that will ultimately be bonded/coupled with the surface where the sensing will take place.

In various implementations of permanent supporting material, the organic material may be a mold compound. The mold compound may include any of a wide variety of compounds, including, by non-limiting example, encapsulants, epoxies, resins, polymers, polymer blends, fillers, particles, thermally conductive particles, electrically conductive particles, pigments, and any other material capable of assisting in forming a stable permanent supporting structure. In some implementations the mold compound may be non-electrically conductive (insulative). In other implementations, the mold compound may be electrically conductive, such as an anisotropic conductive film. In such implementations where the mold compound is electrically conductive, the mold compound is not a metal, but rather is formed as a matrix containing electrically conductive materials, such as, by non-limiting example, metal particles, graphene particles, graphite particles, metal fibers, graphene fibers, carbon fibers, carbon fiber particles, or any other electrically conductive particle or fiber. In various implementations, the mold compound may be a material which has a flexural strength of between about 13 N/mm$^2$ to 185 N/mm$^2$. Flexural strength is the ability of the mold compound to resist plastic deformation under load. Plastic deformation occurs when the mold compound no longer will return to its original dimensions after experiencing the load. For those implementations of permanent supporting material, flexural strength values of the mold compound to be used may generally be selected so that the chosen mold compound has sufficient flexural strength at the maximum expected operating temperature to avoid plastic deformation.

In implementations where mold compounds are employed, a wide variety of methods of applying the mold compound may be utilized, including, by non-limiting example, compression molding, transfer molding, injection molding, or any other molding process.

In various implementations of temporary supporting material, the organic material may include, by non-limiting example, a coating (which may be applied, by non-limiting example, through painting, sputtering, evaporating, electroplating, electroless plating, or spraying or any other method of coating), a tape, a film, a printed structure, a screen printed structure, a stencil printed structure, an adhesive bonded structure, or any other material form capable of being removably or releaseably coupled with the surface of a semiconductor die. A wide variety of material types may be employed in various implementations of temporary die supports, including, by non-limiting example, polyimides, polybenzoxazoles, polyethylenes, metals, benzocyclobutenes (BCBs), photopolymers, adhesives, and any other material or combination of materials capable of being removably or releaseably coupled with a semiconductor die.

In various implementations, two or more layers of organic material may be applied to form the permanent supporting material or temporary supporting material. The layers may be made of the same or different materials. In some implementations, a combination of a permanent supporting material and a temporary supporting material may be formed as an aid of holding/protecting the thinned die during subsequent packaging operations. In such implementations, the material of the permanent supporting material and the temporary supporting material may be the same or different materials.

As illustrated in FIG. 5, following application of the organic material 22 to the thinned semiconductor die 14 to form the permanent supporting material, temporary supporting material, or any combination thereof, the die 14 is released from the forming surface 18. The method of release may include, by non-limiting example, releasing vacuum force against the die surface, applying pressure force against the die surface, releasing magnetic force against the die surface, peeling the die from the surface, or any other method of reversing the force holding the die against the forming surface.

Figure 6:
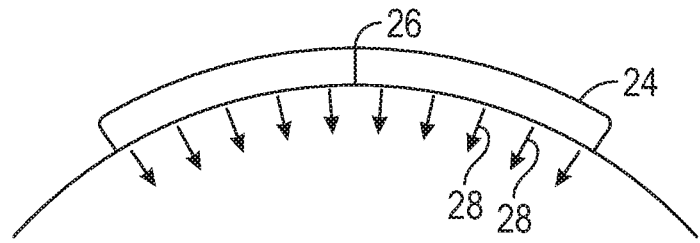
FIG. 6 is a side view of an implementation of two thinned die coupled together through a die street warped against a surface using vacuum force.
Figure 7:
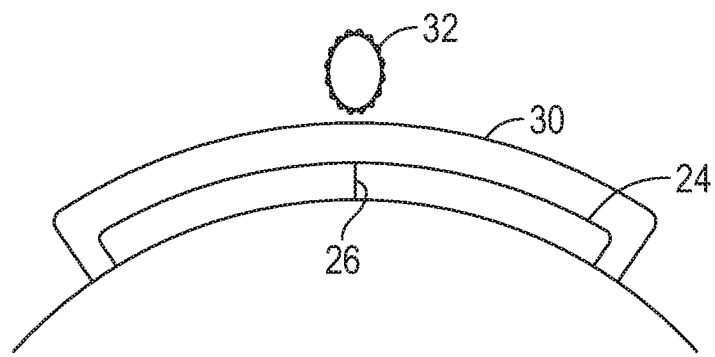
FIG. 7 is a side view of the implementation of the two thinned die of FIG. 6 following application of organic material to the largest planar surface of the thinned die just prior to singulation of the die/organic material using sawing.

Referring to FIG. 6, in various implementations, more than one thinned semiconductor die may be processed in various method implementations. In FIG. 6, two thinned die 24 are illustrated coupled together through die street 26 and are being held against forming surface 18 using vacuum force 28. Similarly to the implementation illustrated in FIG. 5, an organic material 30 is then applied over the thinned die 24 followed by singulation of the die as illustrated in FIG. 7 at the die street 26. As illustrated in FIG. 7, the singulation may be done by sawing 32, but any other method singulating may be employed, including by non-limiting example, sawing, lasering, water jet ablating, scribing, cutting, any combination thereof and any other method of singulating the material of the organic material and/or the semiconductor die. As illustrated, the material of the organic material 30 may extend over the thickness of the thinned die 24 in various implementations. In other implementations involving multiple thinned die, the die may not be singulated, but may remain coupled to the organic material 30 to form a multichip module. In implementations of die which remain coupled together, isolation trenches may be formed in the material of the die street 26 to ensure the die remain electrically isolated from each other (if needed in the particular application). Examples of isolation trenches that may be utilized in particular implementations include a trench or series of vias formed in the material of the die street are filled with an oxide other electrically isolating material. In other multiple die implementations, the thinned die 24 may actually be singulated relative to each other and may be arranged on the surface of the forming surface in a desired arrangement/position relative to each other before application of the permanent support material, temporary support material or any combination thereof. In such implementations, the ability to more precisely arrange the physically separate die may allow for greater die density and/or accuracy of die positioning in the multichip module following coupling through the material of the permanent support material and/or temporary support material. Any of the die curvature support structures disclosed in this document may be employed in various package implementations.

Figure 8:
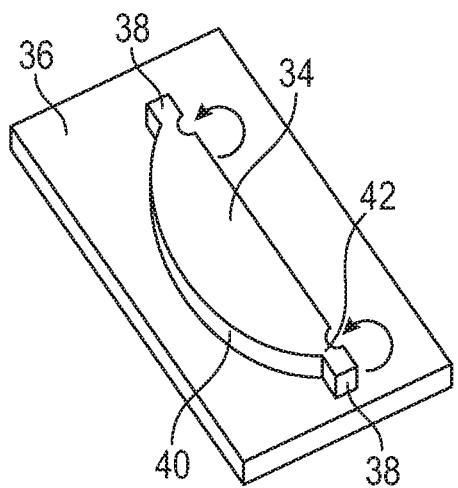
FIG. 8 illustrates an implementation of a die curvature support structure formed to a surface of a thinned die prior to rotation against the surface.
Figure 9:
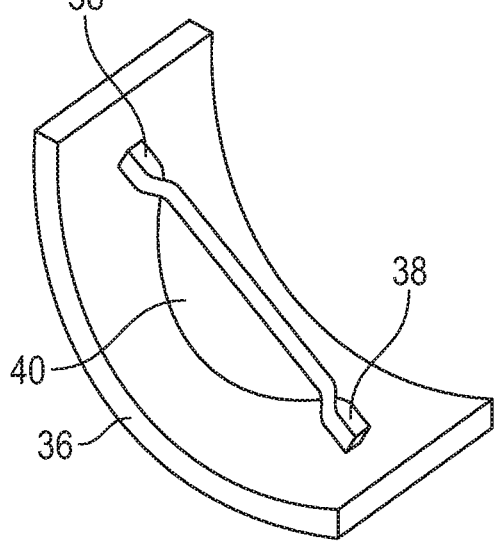
FIG. 9 illustrates the die curvature support structure of FIG. 8 after rotation against the thinned die illustrating the resulting warpage induced in the surface.

While in the method implementations illustrated in FIGS. 3-7 the use of a forming surface to perform the initial warping/bending of the thinned semiconductor die is illustrated, in other implementations, a structure coupled/bonded to the thinned semiconductor die may be used to performing the warping and to support the die at the desired radius of curvature/shape. Referring to FIG. 8, a rotatable die curvature support structure (die support structure) 34 is illustrated coupled over a thinned semiconductor die 36. As illustrated, the arrows show how the structure 34 can be rotated about bonding locations 38 to induce warping in the surface of the die 36 as illustrated in FIG. 9. The rotation is accomplished because the organic material of the die support structure 34 is twistable about a thinned region 42 that couples the central portion 40 to the bonding locations 38. In various implementations, the bonding locations 38 may be coupled with the surface of the die, into the surface of the die, or to a bonding structure/feature in or extending from the surface of the die (such as, by non-limiting example, a pillar, a pad, a projection, stud, or any other feature capable of engaging with the organic material of the bonding locations 38. FIG. 9 illustrates how the die curvature support structure 34 now supports the thinned die in its desired radius of curvature.

The structure illustrated in FIGS. 8-9 may be either a permanent die curvature support or a temporary curvature support. Where the structure is a temporary curvature support, the structure is removed/released from the surface of the thinned semiconductor die at a subsequent step in the packaging process through, by non-limiting example, prying, cutting, etching, dissolving, exposing with light, plasma etching, wet etching, laser cutting, laser ablating, or any other process of removing the organic material of the support.

Figure 10:
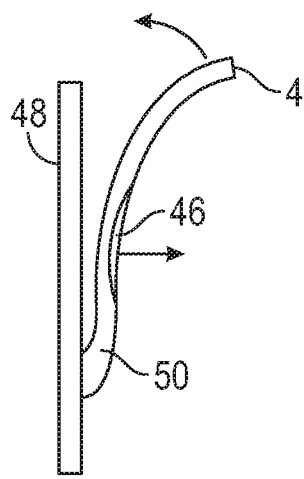
FIG. 10 illustrates an implementation of a die curvature support structure bonded to a surface of an implementation of a thinned die.
Figure 11:
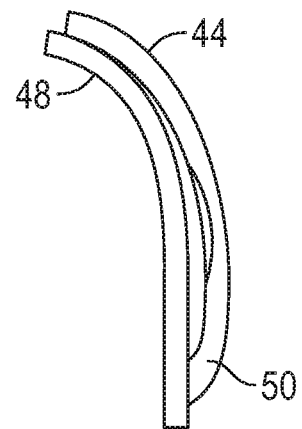
FIG. 11 illustrates the die curvature support structure after bending the die curvature support structure against a surface of the thinned die illustrating the resulting warpage induced in the surface.

FIG. 10 illustrates another implementation of a die curvature support structure 44 that contains one or more thinned portions 46 that form one or more ribs along a largest planar surface of the die curvature support structure 44. Because the one or more thinned portions 46 may be depressions in the material of the die curvature support structure 44, they are designed to allow the die curvature support structure 44 to reversibly (or irreversibly depending on the implementation) invert/bend toward the surface of the die 48 as indicated by the arrows. The effect of the inversion is that at least a portion of the support structure 44 warps the surface of the die 48 and supports it in a desired shape/radius of curvature as illustrated in FIG. 11. The bonding support 50 which couples the die curvature support structure 44 attaches to the surface of the die 48 may couple with the surface of the die using any of the bonding structures/locations disclosed in this document. The structure illustrated in FIGS. 10 and 11 may also be a permanent or temporary curvature support structure. If a temporary die curvature support structure, then any of the methods of removing the temporary die curvature support structures disclosed in this document may be employed in various implementations.

Figure 16:
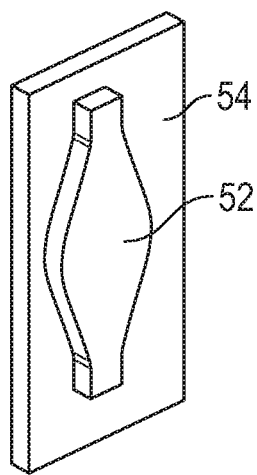
FIG. 16 illustrates an implementation of a die curvature support structure coupled to a surface of a thinned die prior to curing the material of the structure.
Figure 17:
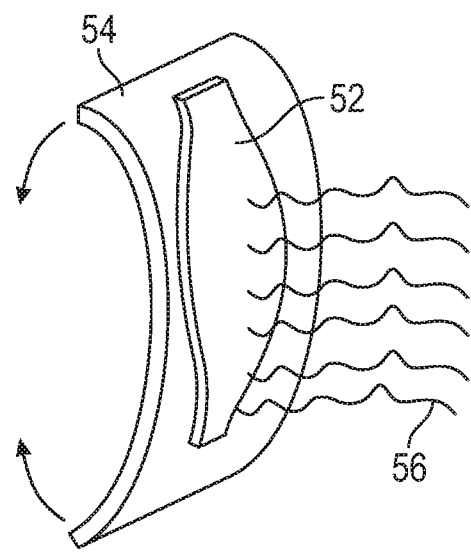
FIG. 17 illustrates the warpage induced in the surface during curing of the material of the implementation of the die curvature support structure illustrated in FIG. 16.

In various implementations of die curvature support structures, particularly those involving permanent support materials, the organic material may be applied in a form that permits it to be coupled in a desired shape and position on the surface of semiconductor die, and then subsequently cured. Depending on the shape of the support structure and/or the organic material of the support structure, the support structure may then warp the thinned in to a desired shape/radius of curvature. Referring to FIG. 16, an implementation of die curvature support structure 52 coupled to a thinned semiconductor die 54 is illustrated. The particular organic material used for this die curvature support structure 52 is a material with a B-stage, like an epoxy or other resin, that permits application of the material in an initial uncured or partially cured state. After application of the organic material, FIG. 17 illustrates the effect of the material on the warpage of the thinned semiconductor die 54 as the B-stage material is cured, in this case by the application of heat 56. As the material of the die curvature support structure 52 cures, it generates a compressive stress on the surface of the die 54 to which the die curvature support structure 52 is coupled. The compressive stress is generated through, by non-limiting example, the shape of the die curvature support structure, the organic material, or any combination thereof. As a result, the die 54 is warped to a desired shape/radius of curvature.

Figure 18:
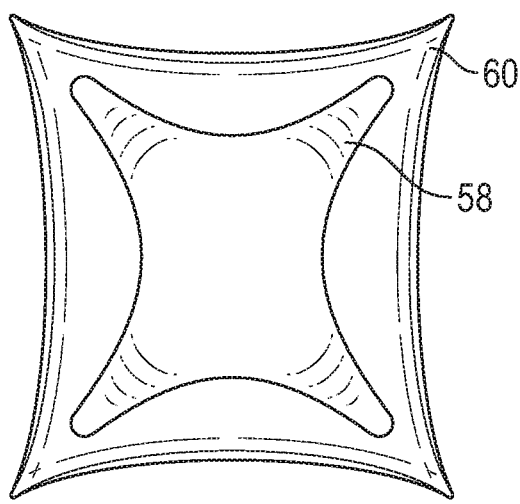
FIG. 18 illustrates another implementation of a die curvature support structure illustrating the resulting warpage in a thinned die.

FIG. 18 illustrates how the use of die curvature support structures of varying shapes that include one or more projections can be used to generate a particular three dimensional shaped surface. In this case, die curvature support structure 58 is made of an organic material and/or has a particular shape that applies a particular pattern of compressive stress to the surface of thinned semiconductor die 60. A wide variety of organic materials and shapes of die curvature support structures may be employed using the principles disclosed in this document to support structures designed to apply the desired compressive/tensile stresses to thinned semiconductor die to produce a desired radius of curvature and/or surface shape.

Figure 12:
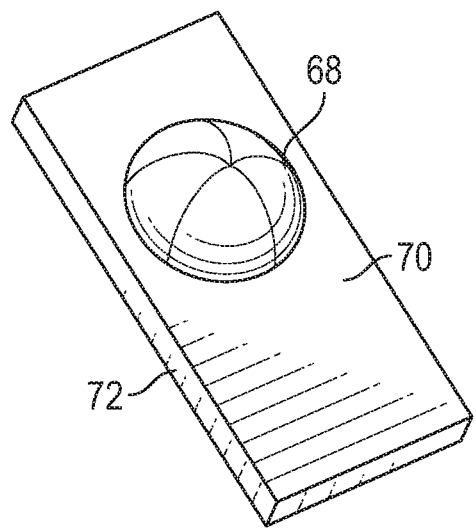
FIG. 12 illustrates an implementation of a permanent or temporary die curvature support coupled to a surface of a thinned die prior to curing the material of the structure.
Figure 13:
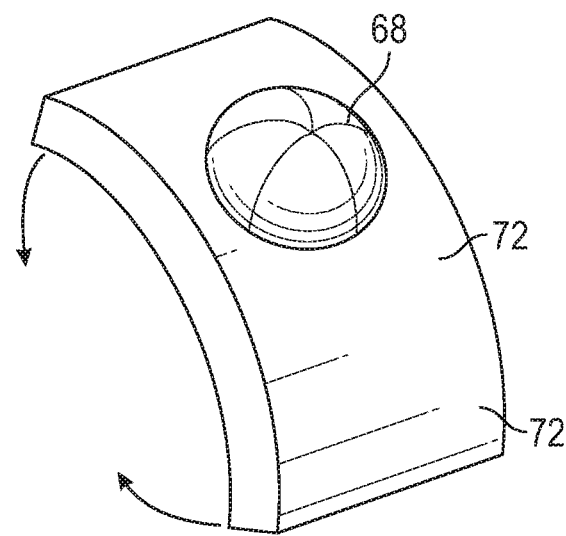
FIG. 13 illustrates the warpage induced in the surface during curing of the material of the implementation of the die curvature support structure illustrated in FIG. 12.

Various additional shapes of die curvature support structures capable of altering the curvature of a thinned die may be employed in various implementations. Referring to FIG. 12, a hemispherical die curvature support structure 68 is illustrated after being coupled to surface 70 of thinned die 72 in an uncured or partially cured condition. The material used for the hemispherical die curvature support structure 68 may be any disclosed in this document. In various implementations, one or more bonding features like any disclosed herein may be employed to assist with securing the coupling of the hemispherical die curvature support structure 68 with the surface 70. FIG. 13 illustrates the warping of the thinned die 72 following curing of the hemispherical die curvature support structure 68 which causes application of compressive stress to the surface 70 of the die 72. The size of the hemispherical die curvature support structure may be varied depending on the shape/geometry of the die. In various implementations, the hemispherical die curvature support structure may not be a perfect hemisphere, but may take substantially the form of a hemisphere. In other implementations, the bottom surface of the hemisphere may not be circular, but may be, by non-limiting example, elliptical, square, rectangular, triangular polygonal, or any other closed shape.

Figure 14:
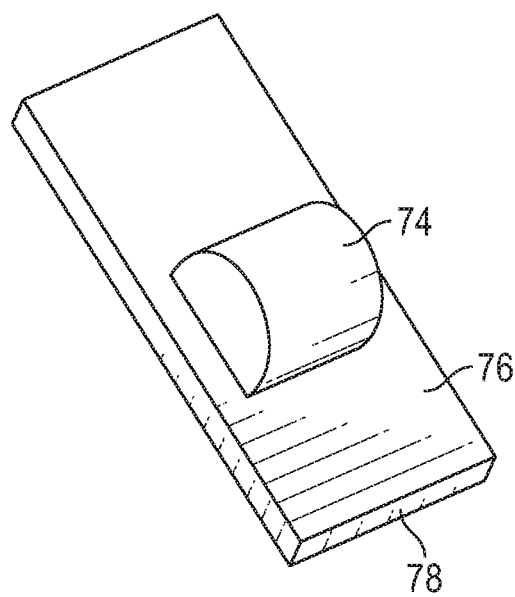
FIG. 14 illustrates an implementation of a permanent or temporary die curvature support coupled to a surface of a thinned die prior to curing the material of the structure.
Figure 15:
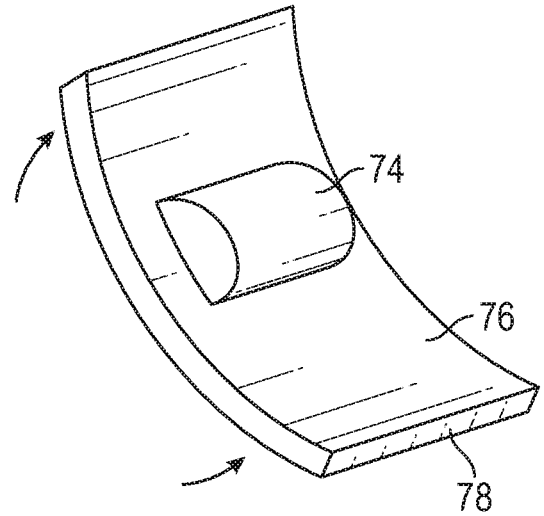
FIG. 15 illustrates the warpage induced in the surface during curing of the material of the implementation of the die curvature support structure illustrated in FIG. 14.

Referring to FIG. 14, an implementation of a die curvature support structure 74 in the form of a horizontal cylindrical segment is illustrated. As in the implementation illustrated in FIG. 12, the die curvature support structure 74 is coupled to surface 76 of die 78 while in an uncured or partially cured state. Any of the organic materials disclosed herein may be employed in various die curvature support structure implementations that are in the form of a horizontal cylindrical segment. FIG. 15 illustrates the semiconductor die 78 following curing of the material of the die curvature support structure 74 which applies a tensile stress to the surface 76 of the die 78 inducing warping in the direction of the arrows in the figure. While the die curvature support structure 74 is illustrated in the form of a horizontal cylindrical segment, any other form of a cylindrical segment including cylindrical wedges may be employed in various implementations.

Figure 19:
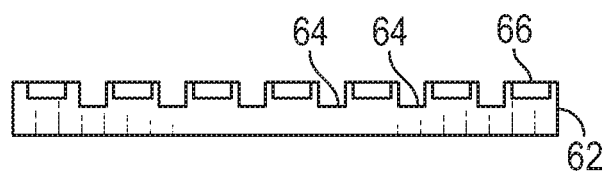
FIG. 19 is illustrates a plurality of die streets and die of a semiconductor die street prior to thinning.

In various method implementations, no precut or partial grooving between the plurality of die of a semiconductor substrate may be carried out as part of the process of forming the thinned semiconductor die disclosed herein. Where the plurality of die will be thinned, the depth of the die/saw streets/scribe lines into the material of the substrate may be sufficient to carry out the various methods of forming semiconductor packages disclosed herein. For example, and with reference to FIG. 19, where the substrate 62 will be thinned to about 10 microns, the about 5 micron depth of the die streets 64 into the material of the substrate/die resulting from the processing steps that form the plurality of semiconductor die 66 suffices to act as the equivalent of any partial grooving/precutting. In particular method implementations, the depth of the die streets can be increased during the die fabrication process. In other particular method implementations, the depth of the die streets may be increased during die preparation/packaging processes following die fabrication. In this way, any separate precut or partial grooving of the wafer using a saw or other process may be rendered unnecessary. Avoiding separately precutting/partial grooving may facilitate the sawing process and/or eliminate risk of sidewall cracking due to coefficient of thermal expansion (CTE) mismatches. While using the depth of the die streets to set sidewall coverage of mold compound rather than the depth of a precut into the semiconductor substrate may reduce the partial sidewall coverage for each die 66 of the plurality of die, the benefits may outweigh the additional coverage in various method implementations.

In various method implementations, the thinned semiconductor die used herein may be processed using a stress relief wet etching process prior to being singulated (and, later, warped). In such implementations, the stress relief wet etching may be carried out with or without backmetal. In some implementations, the stress relief wet etching make take place after protecting the front side (die side) of the semiconductor substrate. The stress relief etching may reduce the backside damage to the semiconductor substrate that is caused by the backgrinding process. The use of the stress relief etching may also facilitate adhesion of the backmetal applied to the ground surface. In various implementations, of thinned die like those disclosed herein which are going to be warped, no backmetal may be applied. A wide variety of sequences of method steps involving coupling die curvature support structures may be carried out using the principles disclosed in this document.

In various semiconductor package and method implementations disclosed in this document, any of the pads or electrical connectors disclosed in this document may be formed, by any or any combination of the following: evaporation, sputtering, soldering together, screen printing, solder screen printing, silver sintering one or more layers of materials. Any of the foregoing may also be used in combination with electroplating or electroless plating methods of forming pads and/or electrical connectors.

In places where the description above refers to particular implementations of curved die systems and implementing components, sub-components, methods and sub-methods, it should be readily apparent that a number of modifications may be made without departing from the spirit thereof and that these implementations, implementing components, sub-components, methods and sub-methods may be applied to other curved die systems.

What is claimed is:

1. A method of forming a curved semiconductor die system, the method comprising:
    coupling a die curvature support structure comprising an organic compound to a surface of a semiconductor die;
    inducing warpage greater than 200 microns in the surface of the semiconductor die using the die curvature support structure prior to directly bonding a second surface of the semiconductor die opposite the surface of the semiconductor die facing the die curvature support structure to a curved surface;
    wherein the die curvature support structure is configured to one of rotate or bend against the surface of the semiconductor die to induce warpage in the surface of the semiconductor die.

2. The method of claim 1, wherein inducing warpage further comprises rotating the die curvature support structure against the surface of the semiconductor die.

3. The method of claim 1, wherein inducing warpage further comprises pressing the die curvature support structure against the surface of the semiconductor die.

4. The method of claim 1, wherein coupling the die curvature support structure further comprises bonding to a bonding structure on the surface of the semiconductor die.

5. The method of claim 1, wherein the semiconductor die is between 0.1 microns and 125 microns in thickness.

6. The method of claim 1, wherein the die curvature support structure comprises a rib, wherein the rib is configured to bend against the surface of the semiconductor die.

7. The method of claim 6, wherein the rib is configured to bend at a thinned portion of the rib.

8. The method of claim 1, wherein a curvature of the warpage is determined by a structure of the organic compound.

9. The method of claim 1, wherein the die curvature support structure is temporary.

10. The method of claim 9, wherein the die curvature support structure is substantially hemispherical.

11. The method of claim 1, wherein the die curvature support structure is configured to contact and one of rotate or bend against the surface of the semiconductor die to induce warpage in the surface of the semiconductor die.

12. The method of claim 1, wherein a longest length of the semiconductor die is greater than a longest length of the die curvature support structure.

13. The method of claim 1, wherein a perimeter of the die curvature support structure is within a perimeter of the semiconductor die.

14. The method of claim 1, wherein the curved semiconductor die system comprises a single die.

15. A method of forming a curved semiconductor die system, the method comprising:
    coupling a die curvature support structure comprising an organic compound to a surface of a semiconductor die, wherein the organic compound is one of uncured or partially cured at a time of coupling to the surface of the semiconductor die;
    inducing warpage greater than 200 microns in the surface of the semiconductor die through curing the die curvature support structure prior to bonding the semiconductor die to a curved surface.

16. A method of forming a curved semiconductor die system, the method comprising:
    warping a first surface of a semiconductor die directly against a forming surface to greater than 200 microns, wherein the forming surface is directly coupled to a concave side of the semiconductor die;
    applying an organic material to an entirety of a second surface of the semiconductor die, the first surface opposite the second surface; and
    releasing the semiconductor die from the forming surface;
    wherein after covering the second surface with the organic material, the semiconductor die is warped to permit bonding with a curved surface.

17. The method of claim 16, further comprising singulating the organic material on the second surface of the semiconductor die.

18. The method of claim 16, wherein the organic material covers a plurality of sidewalls of the semiconductor die between the first surface and the second surface.

19. The method of claim 18, wherein the organic material is a single and continuous material.

* * * * *